(12) United States Patent
Jung et al.

(10) Patent No.: US 12,423,563 B2
(45) Date of Patent: Sep. 23, 2025

(54) NEURAL NETWORK APPARATUS

(71) Applicant: Samsung Electronics Co., Ltd., Suwon-si (KR)

(72) Inventors: Seungchul Jung, Suwon-si (KR); Hyungwoo Lee, Seoul (KR); Sungmeen Myung, Suwon-si (KR); Yongmin Ju, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1039 days.

(21) Appl. No.: 17/238,403

(22) Filed: Apr. 23, 2021

(65) Prior Publication Data
US 2022/0114427 A1    Apr. 14, 2022

(30) Foreign Application Priority Data
Oct. 8, 2020    (KR) .................. 10-2020-0130409

(51) Int. Cl.
*G11C 11/16*    (2006.01)
*G06F 7/544*    (2006.01)
*G06N 3/063*    (2023.01)
*G06N 3/065*    (2023.01)

(52) U.S. Cl.
CPC ........... *G06N 3/063* (2013.01); *G06F 7/5443* (2013.01); *G06N 3/065* (2023.01); *G11C 11/1655* (2013.01)

(58) Field of Classification Search
CPC ....... G06N 3/063; G06N 3/065; G06F 7/5443
See application file for complete search history.

(56) References Cited

U.S. PATENT DOCUMENTS

| | | | |
|---|---|---|---|
| 7,663,916 B2 | 2/2010 | Chih et al. | |
| 8,537,587 B2 | 9/2013 | Li et al. | |
| 8,711,632 B2 | 4/2014 | Katayama | |
| 10,593,375 B2 | 3/2020 | Ishii | |
| 10,658,063 B2 * | 5/2020 | Noro | G11C 29/52 |
| 10,957,392 B2 * | 3/2021 | Lee | G11C 16/26 |
| 11,119,674 B2 * | 9/2021 | Chang | G06F 3/0635 |
| 11,562,229 B2 * | 1/2023 | Lin | G06N 3/063 |
| 2018/0232628 A1 * | 8/2018 | Park | G06N 3/063 |
| 2019/0157349 A1 * | 5/2019 | Kim | G11C 8/14 |
| 2019/0286419 A1 | 9/2019 | Lin et al. | |
| 2019/0325933 A1 * | 10/2019 | Lee | G11C 11/1693 |

(Continued)

FOREIGN PATENT DOCUMENTS

| | | |
|---|---|---|
| JP | 2012-209004 A | 10/2012 |
| JP | 2019-053804 A | 4/2019 |

*Primary Examiner* — Beau D Spratt
(74) *Attorney, Agent, or Firm* — NSIP Law

(57) ABSTRACT

A neural network apparatus includes: a plurality of memory cells each comprising a variable resistance element and a first transistor; a plurality of bit lines extending in a first direction; and a plurality of word lines extending in a second direction, crossing the bit lines and respectively connected to the first transistor of the plurality of memory cells; a plurality of sub-column circuits each comprising memory cells of the memory cells connected in parallel along the first direction; and a column circuit comprising two or more of the sub-column circuits connected in series along the second direction, wherein, when a neural network operation is performed, the column circuit outputs a summation current to a bit line connected to the column circuit based on voltage applied to the plurality of word lines.

15 Claims, 13 Drawing Sheets

(56) References Cited

U.S. PATENT DOCUMENTS

| | | | |
|---|---|---|---|
| 2019/0393270 A1* | 12/2019 | Kim | H10B 63/845 |
| 2021/0271959 A1* | 9/2021 | Chettuvetty | G06F 7/5443 |
| 2021/0279559 A1* | 9/2021 | Nishi | G06N 3/088 |
| 2022/0019884 A1 | 1/2022 | Jung et al. | |

* cited by examiner

NEURAL NETWORK APPARATUS

CROSS-REFERENCE TO RELATED APPLICATIONS

This application claims the benefit under 35 U.S.C. § 119(a) of Korean Patent Application No. 10-2020-0130409, filed on Oct. 8, 2020, in the Korean Intellectual Property Office, the entire disclosure of which is incorporated herein by reference for all purposes.

BACKGROUND

1. Field

The following description relates to a neural network apparatus.

2. Description of Related Art

Neuromorphic processors may perform neural network operations. For example, a neuromorphic processor may include a neuron circuit and a synaptic circuit. Such neuromorphic processors may be used in neural network apparatuses for driving various neural networks such as convolutional neural networks (CNN), recurrent neural networks (RNN), feedforward neural networks (FNN), and may be used in fields including data classification and/or image recognition.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a neural network apparatus includes: a plurality of memory cells each comprising a variable resistance element and a first transistor; a plurality of bit lines extending in a first direction; and a plurality of word lines extending in a second direction, crossing the bit lines and respectively connected to the first transistor of the plurality of memory cells; a plurality of sub-column circuits each comprising memory cells of the memory cells connected in parallel along the first direction; and a column circuit comprising two or more of the sub-column circuits connected in series along the second direction, wherein, when a neural network operation is performed, the column circuit outputs a summation current to a bit line connected to the column circuit based on voltage applied to the plurality of word lines.

A composite resistance value of the column circuit may be greater than a composite resistance value of the sub-column circuit.

Variable resistance elements included in memory cells that share one word line in the column circuit may have a same resistance value.

The apparatus may include a second transistor configured to connect adjacent sub-column circuits from among the two or more sub-column circuits to each other, wherein the second transistor is configured to: connect the adjacent sub-column circuits to each other when the neural network operation is performed, and block connection of the adjacent sub-column circuits when a reading or writing operation is performed on the plurality of memory cells.

The neural network apparatus may be configured to perform a writing operation on one of memory cells sharing one word line in the column circuit by: applying different voltages to both ends of the one memory cell; and applying a same voltage to both ends of the remaining memory cells.

When a reading or writing operation is performed on the plurality of memory cells, one of memory cells sharing one word line in the column circuit may store a weight value for the neural network operation, and remaining memory cells of the memory cells sharing the one word line may perform a reading or writing operation.

When the neural network operation is performed, the weight value stored in the one memory cell may be spread to the remaining memory cells such that variable resistance elements included in the memory cells sharing one word line in the column circuit have a same resistance value.

Memory cells included in each of sub-column circuits adjacent to each other in the second direction from among the two or more sub-column circuits may have a symmetric arrangement structure.

The apparatus may include a source line configured to apply a source voltage to the column circuit, wherein a difference between the source voltage applied to the source line and a voltage applied to the bit line is less than a magnitude of a voltage that varies a resistance value of the variable resistance element.

The variable resistance element may include a magnetic tunnel junction (MTJ) element.

The plurality of word lines may extend side by side in the second direction.

In another general aspect, a neural network apparatus includes: a plurality of word lines extending in a direction and connected to a column circuit; and the column circuit, wherein the column circuit comprises a bit line extending in another direction, and a plurality of sub-column circuits connected in series along the direction, each sub-column circuit comprising a plurality of magnetoresistive random-access memory (MRAM) cells connected in parallel along the other direction; and the column circuit is configured to output a summation current to the bit line based on voltage applied to the plurality of word lines.

The column circuit may include a transistor configured to connect adjacent sub-column circuits of the sub-column circuits in series along the direction, and to write data to an MRAM cell of the MRAM cells, a first voltage may be applied to turn off the transistor, a second voltage may be applied to one of the word lines connected to the MRAM cell to turn on a transistor of the MRAM cell, and a third voltage may be applied to the bit line.

A first MRAM cell of the MRAM cells included in one of the sub-columns and a second MRAM cell of the MRAM cells included in another one of the sub-columns may be connected in series by a shared end, and to write data to the first MRAM cell, a first voltage may be applied to another end of the first MRAM cell, a second voltage may be applied to the shared end, and the second voltage may be applied to another end of the second MRAM cell.

A multiply-accumulate (MAC) result may be generated based at least in part on the output summation current.

Other features and aspects will be apparent from the following detailed description, the drawings, and the claims.

Figure 1:
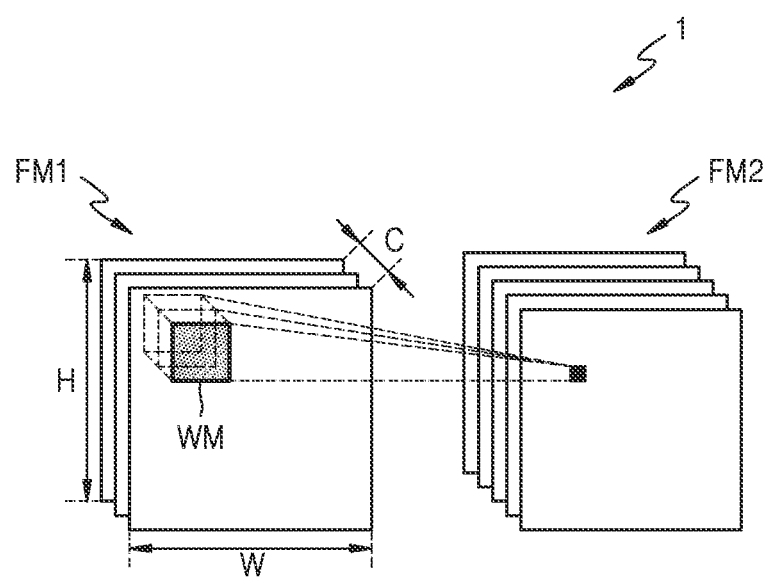
FIG. 1 illustrates an architecture of a neural network according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art, after an understanding of the disclosure of this application, may be omitted for increased clarity and conciseness.

Reference will now be made in detail to embodiments, examples of which are illustrated in the accompanying drawings, wherein like reference numerals refer to like elements throughout. In this regard, the one or more embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Throughout the specification, it will be understood that when a component or element is referred to as being "on," "connected to" or "coupled to" another component or element, it may be directly on, connected to, or coupled to the other component or element, or there may be one or more intervening elements therebetween. In contrast, when a component or element is referred to as being "directly on," "directly connected to," or "directly coupled to" another component or element, there are no intervening components or elements present. Likewise, expressions, for example, "between" and "immediately between" and "adjacent to" and "immediately adjacent to" may also be construed as described in the foregoing. In the descriptions of the embodiments, when a part is connected to another part, this is not only a case that is directly connected, but also a case that is electrically connected with another component therebetween. It will be understood that when a portion includes a component, it does not exclude other components, but may further include other components, unless otherwise stated.

Although terms of "first" or "second" are used to explain various members, components, regions, layers, or sections, the members, components, regions, layers, or sections are not limited to the terms. These terms should be used only to distinguish one member, component region, layer, or section from another member, component region, layer, or section. For example, a "first" member, component region, layer, or section referred to in examples described herein may also be referred to as a "second" member, component region, layer, or section, or similarly, and the "second" member, component region, layer, or section may be referred to as the "first" member, component region, layer, or section within the scope of the right according to the concept of the present disclosure.

The description of the following embodiments should not be construed as limiting the scope of the rights, and what those skilled in the art can easily infer should be construed as belonging to the scope of the embodiments after an understanding of the present disclosure. Hereinafter, embodiments for illustration only will be descried in detail with reference to the accompanying drawings.

FIG. 1 illustrates an architecture of a neural network according to one or more embodiments.

Referring to FIG. 1, a neural network 1 may be a model including nodes and edges. The neural network 1 may be an architecture of a deep neural network (DNN) or n-layers neural networks. The DNN or n-layers neural networks may correspond to convolutional neural networks (CNN), recurrent neural networks (RNN), deep belief networks, restricted Boltzman machines, and the like. For example, the neural network 1 may include, or be implemented with, one or more convolutional neural networks (CNN). However, embodiments are not limited thereto. The neural network 1 of FIG. 1 may correspond to some layers of the convolutional neural networks (CNN). Thus, the neural network 1 may correspond to a convolution layer, a pooling layer, a fully connected layer, and the like of the convolutional neural networks (CNN). However, hereinafter, for conveniences, it is assumed that the neural network 1 corresponds to the convolution layer of the convolutional neural networks (CNN).

In the convolution layer, a first feature map FM1 may correspond to an input feature map, and a second feature map FM2 may correspond to an output feature map. The feature map may be a data set in which various features of input data are expressed, and the second feature map FM2 may be a data set representing various features of output data resulting from convolution operations being performed by applying a weight map WM to the first feature map FM1. The first and second feature maps FM1 and FM2 may be a high-dimensional matrix of two or more dimensions, and have respective activation parameters. When the feature maps FM1 and FM2 correspond to three-dimensional feature maps, for example, the feature maps FM1 and FM2 may have a width W (or referred to as a column), a height (or referred to as a row), and a depth C. In this case, the depth C may correspond to the number of channels.

In the convolution layer, a convolution operation may be performed on the first feature map FM1 and a weight map WM. As a result, the second feature map FM2 may be generated. The weight map WM may filter the first feature map FM1 and is referred to as a weight filter or weight kernel. In an example, the depth of the weight map WM, i.e., the number of channels of the weight map WM may be the same as the depth of the first feature map FM1, i.e., the number of channels of the first feature map FM1. The weight map WM may be shifted to transverse the first feature map FM1 as a sliding window. During each shift, each of weights included in the weight map WM may be multiplied and added to all feature values in an area overlapping the first feature map FM1. As the first feature map FM1 and the weight map WM are convoluted, one channel of the second feature map FM2 may be generated.

In the drawings of FIGS. 4A through 9 to be described later, voltage transmitted through word lines may be a bit value corresponding to an input activation included in the input feature map. A resistance value or data value (0 or 1) of a variable resistance element may be a bit value corresponding to the weight map WM.

Neural network generating apparatuses according to one or more embodiments may perform a neural network operation by using the bit value corresponding to the input activation and bit values corresponding to the weight map WM. The neural network operation may be an operation relating to a binary neural network (BNN).

Although one weight map WM is indicated in FIG. 1, substantially, a plurality of weight maps may be convoluted with the first feature map FM1 such that a plurality of channels of the second feature map FM2 may be generated. Also, the second feature map FM2 of the convolution layer may be an input feature map of a next layer. For example, the second feature map FM2 may be an input feature map of a pooling layer. However, embodiments are not limited thereto.

Figure 2:
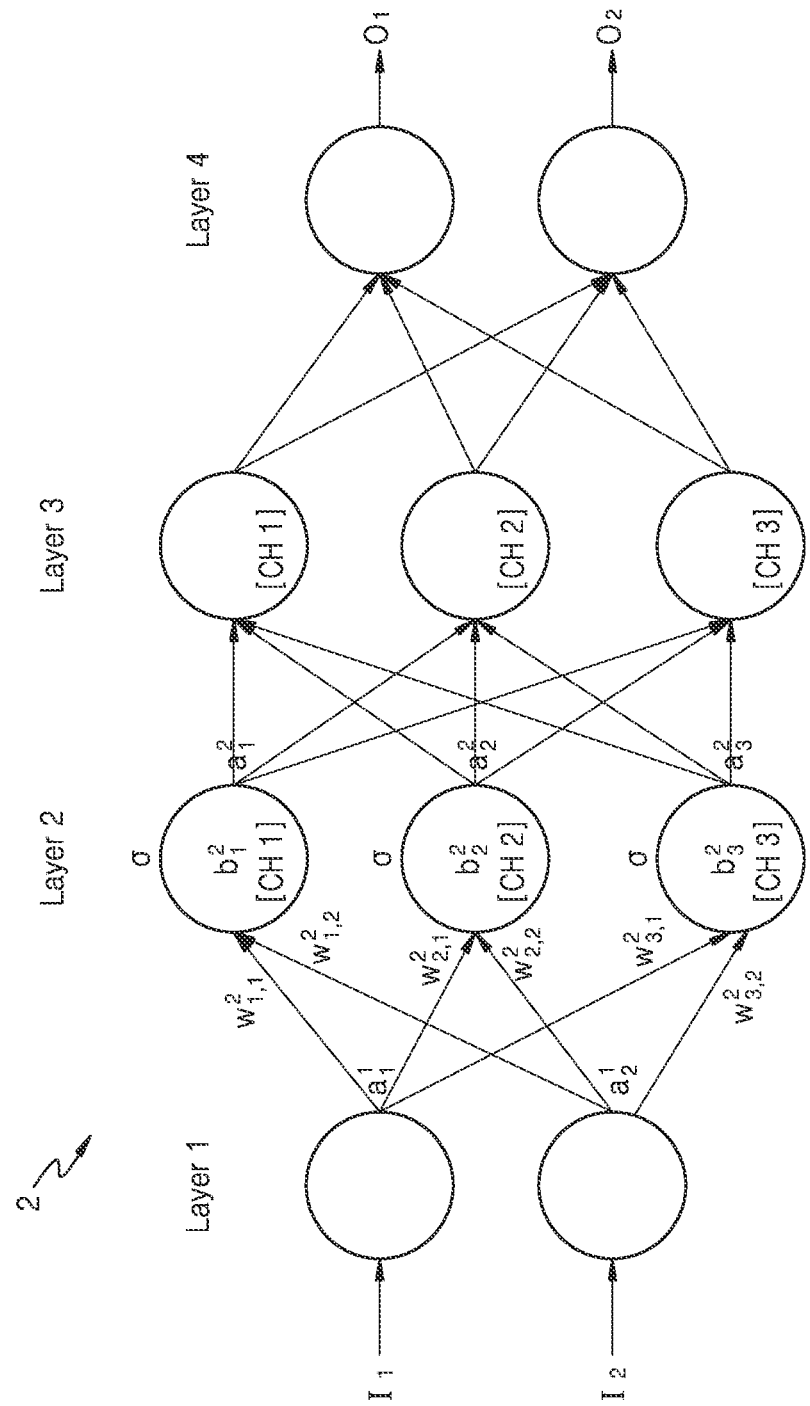
FIG. 2 illustrates an operation performed in a neural network according to one or more embodiments.

FIG. 2 illustrates an operation performed in a neural network according to one or more embodiments.

Referring to FIG. 2, a neural network 2 may have a structure including an input layer, hidden layers, and an output layer, may perform an operation based on received input data (for example, $I_1$ and $I_2$), and may generate output data (for example, $O_1$ and $O_2$) based on the result of performing the operation.

The neural network 2 may be a DNN or n-layers neural networks including two or more hidden layers, as described above. For example, as shown in FIG. 2, the neural network 2 may be a DNN including an input layer Layer 1, two hidden layers Layer 2 and Layer 3, and an output layer Layer 4. When the neural network 2 is implemented with a DNN architecture, the neural network 2 includes many layers that may process valid information. Thus, the neural network 2 may process more complicated or complex data sets than a neural network having a single layer. Also, although FIG. 2 shows that the neural network 2 includes four layers, this is just an example, and the neural network 2 may include less or more layers or less or more channels. That is, the neural network 2 may include layers having various structures different from those shown in FIG. 2.

Each of the layers included in the neural network 2 may include a plurality of channels. The plurality of channels may include or represent a plurality of artificial nodes (also known as neurons, processing elements (PEs), units, or similar terms), configured to process data of the corresponding channel. For example, as shown in FIG. 2, Layer 1 may include two channels (nodes), and each of Layer 2 and Layer 3 may include three channels (nodes). Also, this is just an example, and each of the layers included in the neural network 2 may include different numbers of channels (nodes). While the nodes may be referred to as "artificial nodes" or "neurons," such reference is not intended to impart any relatedness with respect to how the neural network architecture computationally maps or thereby intuitively recognizes information and how a human's neurons operate. I.e., the terms "artificial nodes" or "neurons" are merely terms of art referring to the hardware implemented nodes of the neural network 2.

The channels included in each of the layers of the neural network 2 may be connected to one another to process data. For example, one channel may receive data from other channels to perform an operation or to output the result of the operation to other channels.

Each of an input and an output of each of the channels may be respectively referred to as an input activation and an output activation. That is, the activation may be an output of one channel and simultaneously a parameter corresponding to an input of channels included in the next layer. Also, each of the channels may determine its own activation based on activations received from channels included in the previous layer and weights. The weight that is a parameter used to calculate an output activation at each channel may be a value allocated to a connection relationship between the channels. For example, an output from a previous layer's channel may be provided to as an input to a channel of a next or subsequent layer through a weighted connection between the previous layer's channel and the channel of the next layer, with the weight of the weighted connection being variously adjusted during the training of the neural network until the neural network is trained for a desired objective. There may be additional connections to the channel of the next layer, such as for providing a bias connection value through a connection that may or may not be weighted and/or for providing the above example recurrent connection which may be weighted. During training and implementation such connections and connection weights may be selectively implemented, removed, and varied to generate or obtain a resultant neural network that is thereby trained and that may be correspondingly implemented for the trained objective, such as for any of the above example recognition objectives.

Accordingly, each of the channels, or representative nodes of such a channel, may be processed by a computational or processing element (e.g., a PE) for outputting an output activation by receiving an input (e.g., through, or by further considering, such weighted connections), and an input-output of each of the channels may be mapped. The computational element may be configured to perform the activation function for a node. As a non-limiting example, when a is an activation function, $w_{jk}^i$ is a weight from a k-th channel included in an (i−1)-th layer to a j-th channel included in an i-th layer, $b_j^i$ is a bias of the j-th channel included in the i-th layer and $a_j^i$ is an activation of the j-th channel included in the i-th layer, the activation may be calculated using equation 1 below.

$$a_j^i = \sigma\left(\sum_k (w_{ij}^i \times a_k^{i-1}) + b_j^i\right) \quad \text{Equation 1}$$

As shown in FIG. 2, an activation of a first channel CH1 of a second layer Layer 2 may be expressed $a_1^2$. Also, $a_1^2$ may have a value of $a_1^2 = \sigma(w_{1,1}^2 \times a_1^1 + w_{1,2}^2 \times a_2^1 + b_1^2)$ according to equation 1. The activation function a may be a rectified linear unit (ReLU). However, embodiments are not limited thereto. For example, the activation function a may be Sigmoid, hyperbolic tangent tan h, and Maxout.

As described above, in the neural network 2, numerous data sets may be exchanged between a plurality of channels interconnected, and an operation process may be performed while passing through layers. In the computation process, numerous multiply-accumulate (MAC) operations may be performed, and numerous memory access operations for loading an activation and a weight to be calculated of the MAC operation at an appropriate time need to be performed together.

Also, in a general or typical digital computer, a computational element and memory are separated from each other, and thus a Von Neumann structure including a common data bus for data transmission between two separated blocks is used. Thus, in the process of implementing the neural network 2 in which data movement and operations are continuously repeated using the typical digital computer, a lot of time may be required for data transmission, and excessive power may be consumed. In order to solve these problems, an in-memory computing circuit of one or more embodiments integrates the memory and the computational element for performing the MAC operation. Hereinafter, an in-memory computing circuit will be described in more detail with reference to FIG. 3.

Figure 3:
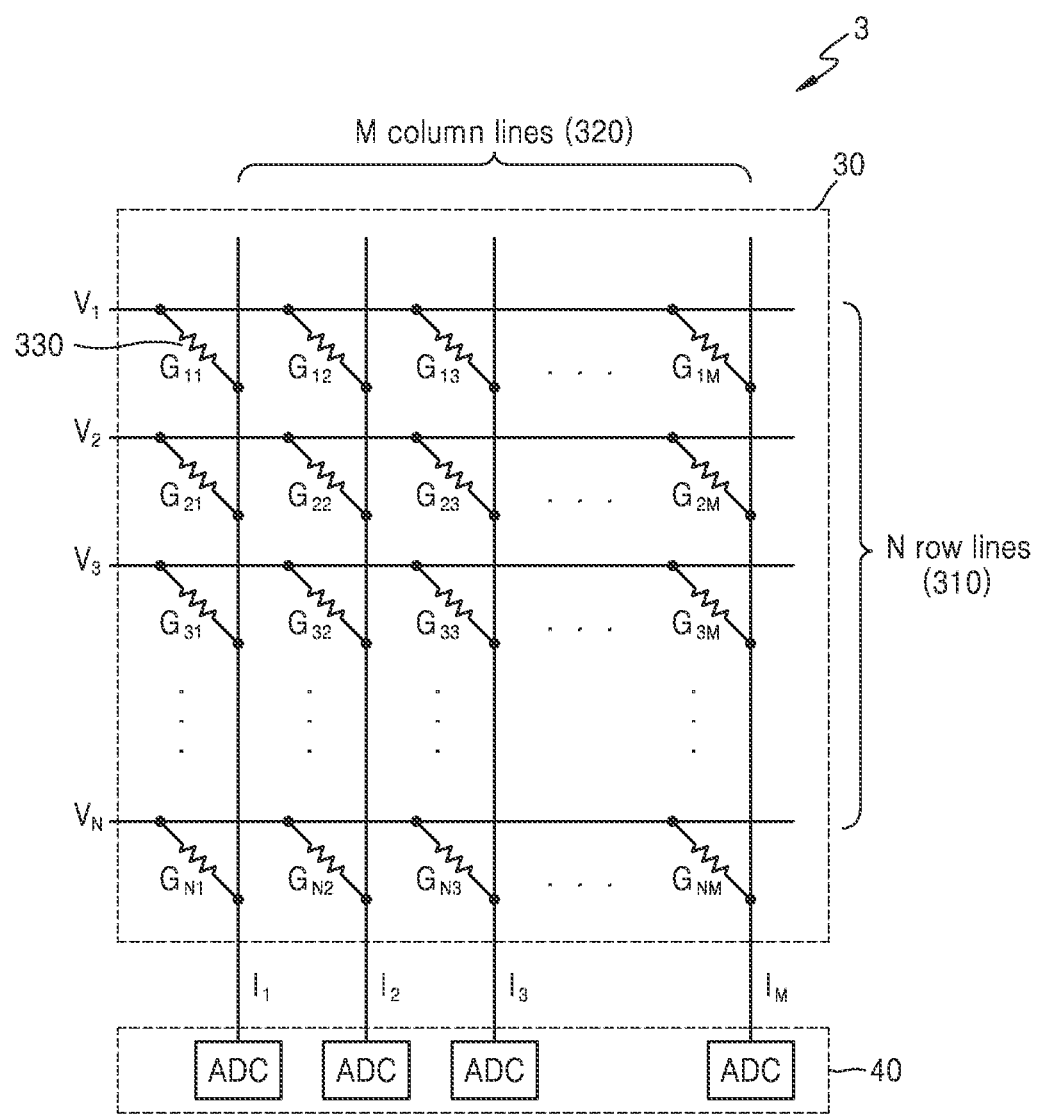
FIG. 3 illustrates an in-memory computing circuit according to one or more embodiments.

FIG. 3 illustrates an in-memory computing circuit according to one or more embodiments.

Referring to FIG. 3, the in-memory computing circuit 3 may include an analog crossbar array 30 and one or more analog to digital converters (ADCs) 40. However, in the in-memory computing circuit 3 shown in FIG. 3, while components related to the present embodiments are shown, it will be apparent to those skilled in the art after an understanding of the present disclosure that the in-memory computing circuit 3 may further include other general-purpose components than the components shown in FIG. 3.

The analog crossbar array 30 may include a plurality of row lines 310, a plurality of column lines 320, and a plurality of memory cells 330. The plurality of row lines 310 may be used to receive the input data. For example, when the plurality of row lines 310 are N (where N is an arbitrary natural number) row lines, voltages $V_1, V_2, \ldots,$ and $V_N$ corresponding to input activations may be applied to the N row lines. The plurality of column lines 320 may cross the plurality of row lines 310. For example, when the plurality of column rows 320 are M (where M is an arbitrary natural number) column lines, the plurality of column lines 320 and the plurality of row lines 310 may cross one another at N×M crossing points.

Also, the plurality of memory cells 330 may be arranged at crossing points of the plurality of row lines 310 and the plurality of column lines 320. Each of the plurality of memory cells 330 may be implemented with non-volatile memory, such as resistive RAM (ReRAM), magnetic RAM (MRAM), and eFlash, so as to store weights. Each of the plurality of memory cells 330 may be volatile memory, such as static random access memory (SRAM).

In the example shown in FIG. 3, the plurality of memory cells 330 have a plurality of conductance $G_{11}, \ldots,$ and $G_{NM}$ corresponding to the weights. Thus, when voltage corresponding to the input activation is applied to each of the plurality of row lines 310, current having the magnitude of I=V×G according to the Ohm's law may be output to each of the memory cells 330. When currents output from memory cells arranged along one column line are added to each other, current sums $I_1, \ldots,$ and $I_M$ may be output along the plurality of column lines 320. The current values $I_1, \ldots,$ and $I_M$ may correspond to the result of the MAC operation performed in an analog manner.

The ADC 40 may convert a result (i.e., the current sums $I_1, \ldots,$ and $I_M$) of the analog MAC operation output from the analog crossbar array 30 into digital signals. A result of the MAC operation converted into the digital signals may be output from the ADC 40 and used in a subsequent process of a neural network operation.

In FIG. 3, the memory cells are resistive elements. However, the memory cells may have more complicated structures. For example, when the plurality of memory cells are implemented with magnetoresistive random-access memory (MRAM), each of the plurality of memory cells may include a variable resistance element and a transistor. Hereinafter, non-limiting examples where the MRAM is employed, will be described in further detail below with reference to FIGS. 4A through 4C.

Figure 4A:
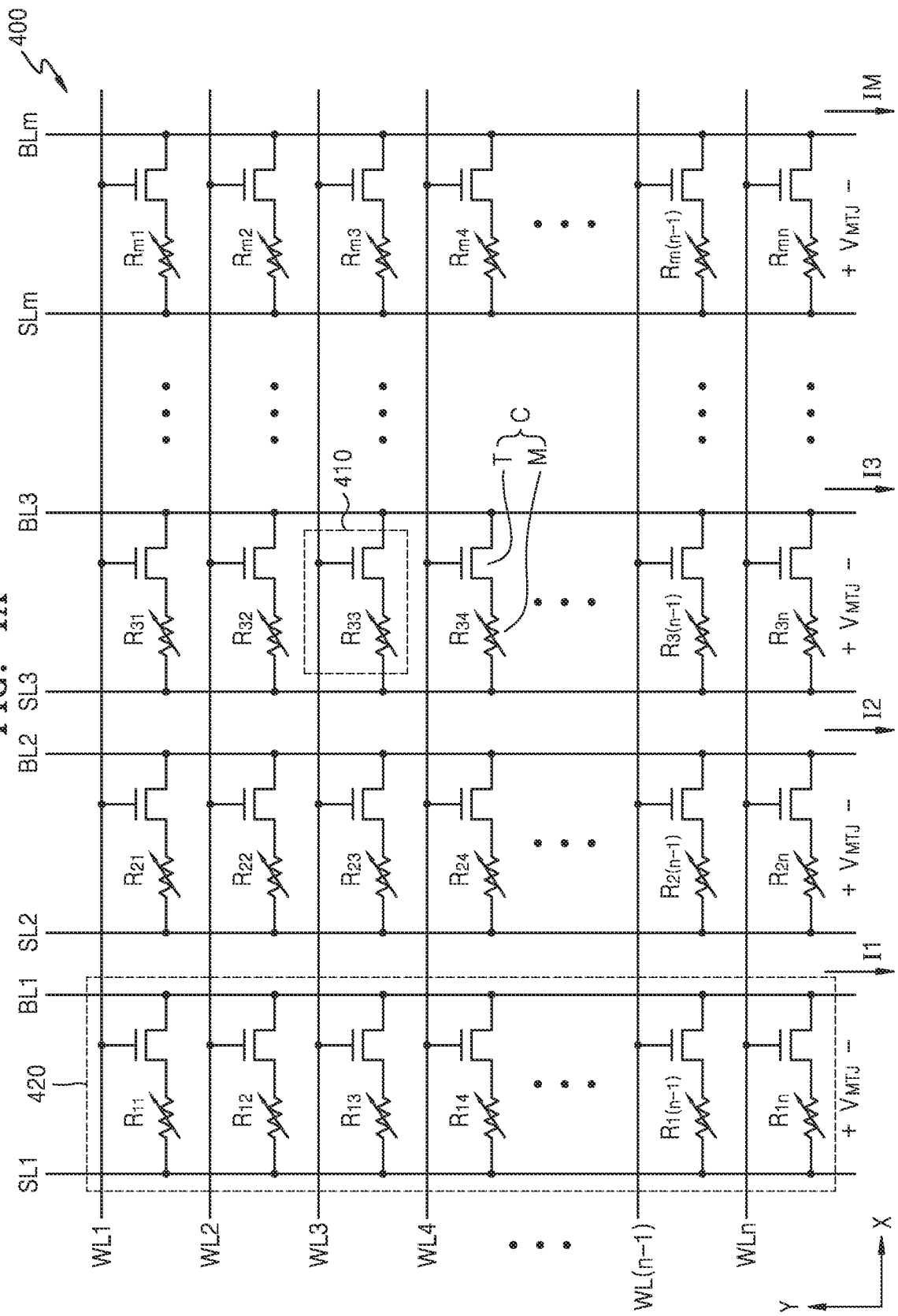
FIGS. 4A through 4C illustrate a structure and an operating method of a memory cell array according to one or more embodiments.
Figure 4B:
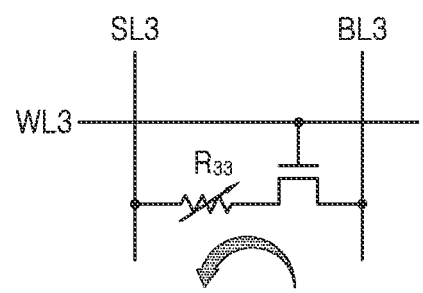
Figure 4C:
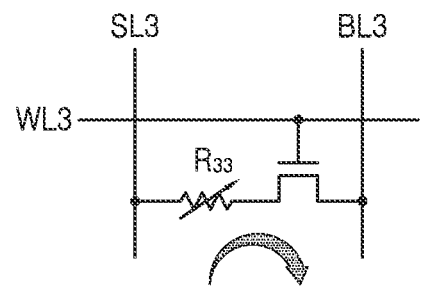

FIGS. 4A through 4C illustrate a structure and an operating method of a memory cell array according to one or more embodiments.

Referring to FIG. 4A, a neural network apparatus having a parallel structure is shown. For example, the memory cell array 400 of the neural network apparatus may include a plurality of memory cells C arranged in the form of a matrix. Each of the plurality of memory cells C may include a transistor T and a variable resistance element M. Also, the memory cell array 400 may include a plurality of word lines WL WL1, WL2, ..., and WLn, a plurality of bit lines BL BL1, BL2, ..., and BLm, and a plurality of source lines SL SL1, SL2, ..., and SLm. Each of the plurality of memory cells C may be electrically connected to a corresponding word line, a corresponding bit line, and a corresponding source line.

The plurality of word lines WL1, WL2, . . . , and WLn may be arranged in parallel to one another in a first direction (Y-direction) and may extend in a second direction (X-direction). The plurality of bit lines BL1, BL2, . . . , and BLn may be arranged in parallel to one another in the second direction while extending in the first direction. The plurality of source lines SL1, SL2, and SLn may be arranged in parallel to one another in the second direction while extending in the first direction in the same manner as the plurality of bit lines BL1, BL2, . . . , and BLn. The plurality of word lines WL1, WL2, . . . , and WLn may extend side by side in the second direction crossing the first direction and may be connected to the transistor T of each of the plurality of memory cells.

The plurality of bit lines BL1, BL2, . . . , and BLn may be connected to a drain or source of the transistor T of the plurality of memory cells C, and the plurality of source lines SL1, SL2, and SLn may be connected to a source or drain of the plurality of memory cells C. Here, the source line may be connected to the drain or source of the corresponding transistor T via the corresponding variable resistance element M.

When one of the plurality of word lines WL1, WL2, . . . , and WLn and one of the plurality of source lines SL1, SL2, . . . , and SLn or the plurality of bit lines BL1, BL2, . . . , and BLn are selected based on this connection relationship, one memory cell C may be selected. For example, when a third word line WL3 and a third source line SL3 or a third bit line BL3 are selected, a memory cell 410 including a variable resistance element $R_{33}$ may be selected.

When one word line and one bit line are selected, a corresponding source line may be automatically determined. Similarly, when one word line and one source line are selected, a corresponding bit line may be automatically determined.

The transistor T that constitutes the memory cell C may be turned on or turned off according to a voltage of the word line to control the supply of current to a corresponding variable resistance element M. For example, the transistor T may be a metal oxide semiconductor (MOS) transistor or bipolar transistor. Also, the memory M that constitutes the memory cell C may include a magnetic substance. For example, the variable resistance element M may include a magnetic tunnel junction (MTJ) element. The variable resistance element M may perform a memory function using a spin transfer torque (STT) phenomenon in which the direction of magnetization of the magnetic substance varies by an input current.

The polarity of a ferromagnetic plate among two ferromagnetic plates included in an MTJ element may be changed according to the direction of current flowing through the MTJ element. Thus, a resistance value of the MTJ element may be changed. When two ferromagnetic plates have the same polarity, they may have a low resistance value, and when two ferromagnetic plates have different polarities, they may have a high resistance value. Each of the low resistance value and the high resistance value may correspond to 1-bit data (i.e., "0" or "1"). Thus, applying a current in a specific direction to the MTJ element may correspond to an operation of writing data.

In order to store data of "0" and "1" in the MTJ element, current through the MTJ element may flow in both directions. That is, the direction of the current flowing through the MTJ element when writing data "0" may be opposite to the direction of the current flowing through the MTJ element and when wring data "1". In order to form a structure that allows current to flow in the opposite directions, a source line in addition to a bit line exist in a magnetic memory device. By changing voltages applied to the bit line and the source line, the direction of the current flowing through the MTJ element may be switched.

Also, the resistance of the MTJ element corresponding to each of "0" and "1" states may be respectively referred to as "$R_P$" and "$R_{AP}$". For example, $R_p$ and $R_{AP}$ may have resistance values of 1 kΩ and 2 kΩ, respectively. The above-described resistance values are for only examples, and the resistance values $R_p$ and $R_{AP}$ of the MTJ element are not limited thereto.

Referring to FIG. 4B, when data "1" is to be written to the selected memory cell 410, first, when the third word line WL3 and the third bit line BL3 (or the third source line SL3) are selected, the selected memory cell 410 may be determined. When the selected memory cell 410 is determined, a high voltage may be applied to the third bit line BL3, a low voltage may be applied to the third source line SL3, and an appropriate turn-on voltage may be applied to the third word line WL3 such that a current path indicated by the arrow may be generated and thus, data "1" may be written to the MTJ element of a selected memory cell Cs. Here, as a non-limiting example, the voltage applied to the third bit line BL3 may be 1.2V, and the voltage applied to the third source line SL3 may be 0V. However, the voltages applied to the above-described lines are exemplary values, and embodiments are not limited to the above-described values. For example, the high voltage and the low voltage may be any number of values, where the high voltage is greater than the low voltage.

Referring to FIG. 4C, when data "0" is written to the selected memory cell 410, when the third word line WL3 and the third bit line BL3 (or the third source line SL3) are selected in the same manner as the description of FIG. 4B, the selected memory cell 410 may be determined. When the selected memory cell 410 is determined, a high voltage may be applied to the third source line SL3, a low voltage may be applied to the third bit line BL3, and an appropriate turn-on voltage may be applied to the third word line WL3 such that the current path indicated by the arrow may be generated. Thus, data "0" may be written to the MTJ element of the selected memory cell 410. Here, as a non-limiting example, voltage applied to the third bit line BL3 may be 0V, and voltage applied to the third source line SL3 may be 1.2V. That is, the voltages when writing the data "1", and the magnitudes thereof may be the same, but by applying voltage in an opposite direction, data "0" may be written to the MTJ element. As described when writing data "1", since the voltage value is only an exemplary value, another voltage value may be applied.

Also, a method of recording data "1" or "0" in the selected memory cell 410 is not limited to the above-described methods. For example, when a current path is generated in a direction of the arrow of FIG. 4C, data "1" may be recorded, and when a current path is generated in a direction of the arrow of FIG. 4B, data "0" may be recorded.

Referring back to FIG. 4A, the memory cells C arranged along the first direction (Y-direction) may be connected to one another in parallel such that one column circuit 420 may be constituted. For example, the column circuit 420 indicated in a dotted line may be configured in such a way that n memory cells C arranged in the first source line SL1 and the first bit line BL1 along the first direction are connected to one another in parallel.

When a neural network operation is performed, since the memory cells C may have resistances $R_{11}$, $R_{12}$, $R_{13}$, $R_{14}$, ..., and Rmn corresponding to the weights, when voltage corresponding to an input activation is applied to each of the plurality of word lines WL1, WL2, ..., and WLn, the transistor T may be turned on or turned off to control the supply of current to the variable resistance element M. When the transistor T is turned on, current having the magnitude of I=V/R may be output through each memory cell C according to the Ohm's law (where V=voltage applied between a source line and a bit line, and R=a resistance value of a variable resistance element). Since currents are output from memory cells arranged along one column circuit, summation currents $I_1$, ..., and $I_m$ may be respectively output along the plurality of bit lines BL1, BL2, ..., and BLm. The summation currents $I_1$, ..., $I_m$ may correspond to the result of the neural network operation performed in an analogue manner.

Also, when the neural network operation using the memory cell array 400 shown in FIG. 4A outputs the summation currents, an addition operation between the memory cell arrays 400 may be performed, and the size of the memory cell 410 may be small, and a general parallel memory cell array structure may be utilized. However, in a non-volatile memory device, such as MRAM, a resistance value may be determined through a production process. In this case, the resistance value of a device may be small (e.g., several kΩ). Thus, when these memory cells are connected to one another in parallel, a very large current may flow when voltage is applied. For example, when 64 memory cells are connected to one another in parallel, the resistance value of the entire memory cell may be 1/64. Since a large current flowing through the memory cell may result in a large power consumption, the overall power efficiency may be decreased.

According to the present disclosure, a neural network apparatus of one or more embodiments in which the structure of the memory cell array 400 of FIG. 4A is utilized and low-power design is easily performed, may be provided. That is, the neural network apparatus of one or more embodiments may reduce the aforementioned large power consumption, and thereby improve the overall power efficiency. Hereinafter, the effective structure and operation of the neural network apparatus of one or more embodiments will be described in detail with reference to the drawings.

Neural network apparatuses of one or more embodiments to be described with reference to FIGS. 5A through 9, which will be described later, may maintain the memory cell array structure shown in FIG. 4A, but may have a structure in which only some components or a connection relationship between lines are changed. Thus, symbols of the plurality of source lines SL1, SL2, ..., and SLn or the plurality of bit lines BL1, BL2, ..., and BLn) indicated for description in FIG. 4A may be quoted as they are.

Figure 5A:
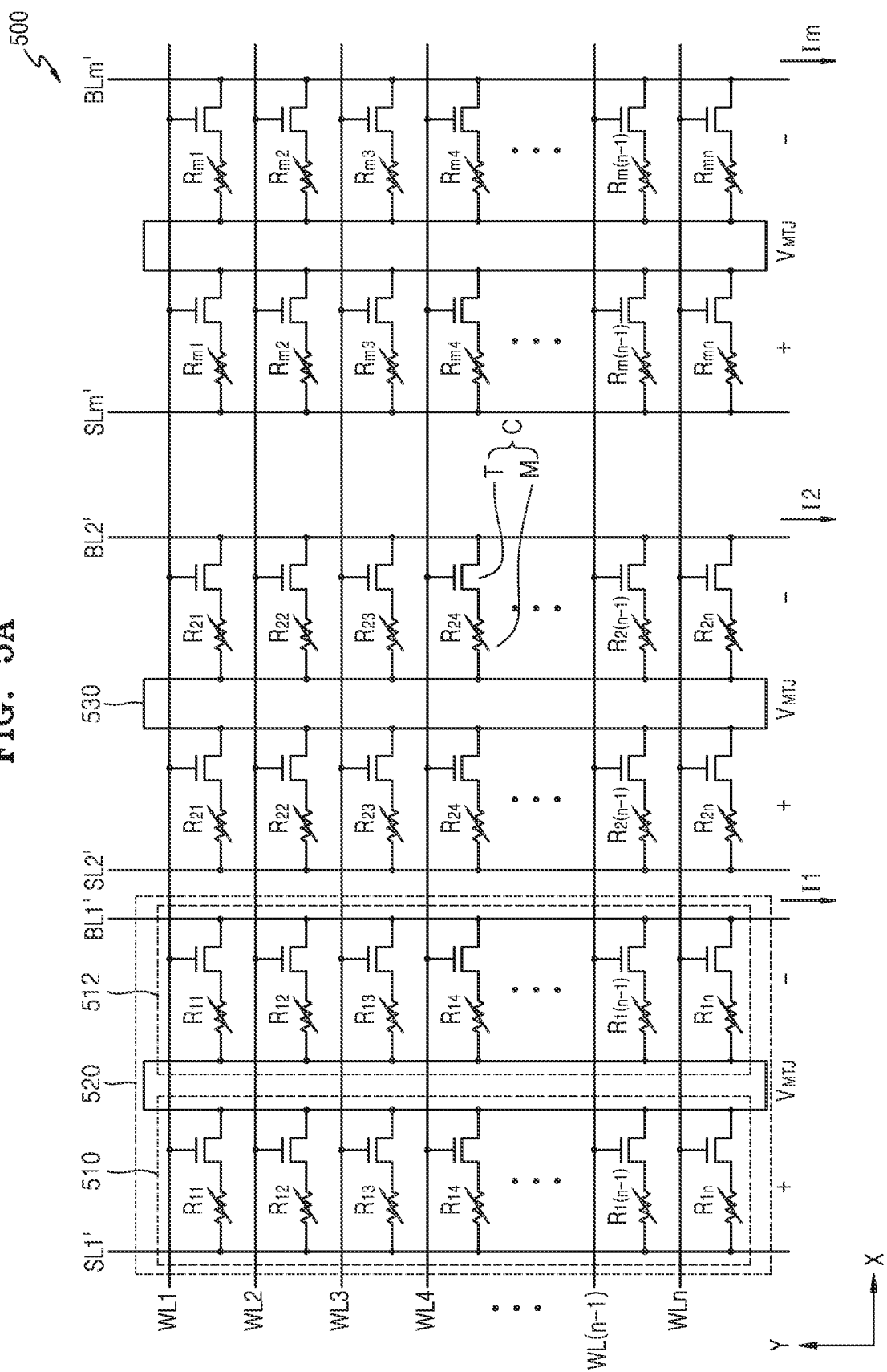
FIGS. 5A and 5B illustrate circuit diagrams of a neural network apparatus according to one or more embodiments.
Figure 5B:
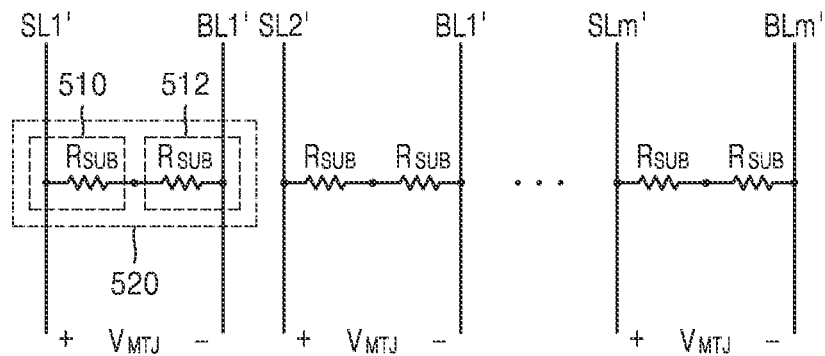

FIGS. 5A and 5B illustrate circuit diagrams of a neural network apparatus according to one or more embodiments.

Referring to FIG. 5A, a neural network apparatus 500 may include a plurality of memory cells C, a plurality of bit lines BL1', BL2', ..., and BLm', and a plurality of word lines WL1, WL2, ..., and WLn. The plurality of bit lines BL1', BL2', ..., and BLm', and the plurality of word lines WL1, WL2, ..., and WLn may respectively correspond to the plurality of bit lines BL1, BL2, ..., and BLm and the plurality of word lines WL1, WL2, ..., and WLn described above with reference to FIG. 4A. For example, the plurality of bit lines BL1', BL2', ..., and BLm' may extend in the first direction, and the plurality of word lines WL1, WL2, ..., and WLn may extend side by side in the second direction crossing the first direction. Each of the plurality of memory cells C may include a variable resistance element M and a transistor T, and the transistor T of each of the plurality of memory cells C may be connected to one of the plurality of word lines WL1, WL2, ..., and WLn.

Memory cells arranged along the first direction (Y-direction) may be connected in parallel and may constitute one sub-column circuit 510, and two or more sub-column circuits 510 and 512 may be connected in series along the second direction (X-direction) and may constitute one column circuit 520. FIG. 4A illustrates that memory cells connected in parallel constitute one column circuit 420. In contrast, in the neural network apparatus 500, sub-column circuits connected in series may constitute one column circuit 520.

Since the column circuit 420 of FIG. 4A has a low composite resistance value, a low-power structure may not be achieved. In contrast, FIG. 5A illustrates that the composite resistance value of the column circuit 520 may be increased while utilizing the existing array structure of FIG. 4A. Thus, low-consumption design may be performed. That is, for example, the neural network apparatus 500 of one or more embodiments may reduce power consumption, compared to a typical neural network apparatus utilizing the memory cell array 400, while still utilizing the memory cell array 400. For example, when resistance values of the variable resistance element included in the sub-column circuit 510 are $R_{11}$, $R_{12}$, ... $R_{1n}$ and the composite resistance value of the sub-column circuit 510 is $R_{SUB}$, the composite resistance value $R_{EQ}$ of one column circuit 520 may be calculated by equation 2 below.

$$R_{EQ} = 2R_{SUB} = \frac{1}{\frac{1}{R_{11}} + \frac{1}{R_{12}} + \ldots + \frac{1}{R_{1n}}} \times 2 = \frac{1}{\frac{1}{2 \times R_{11}} + \frac{1}{2 \times R_{12}} + \ldots + \frac{1}{2 \times R_{1n}}} \quad \text{Equation 2}$$

Referring to Equation 2, as two sub-column circuits 510 and 520 are connected in series to constitute one column circuit 520, an effect of doubling the resistance value of the variable resistance element M included in the memory cell C may occur. For example, the sub-column circuits 510 and 512 may be connected in series such that an effect of parallel connection of the variable resistance elements M having doubled resistance values may occur.

Referring to FIG. 5B, the composite resistance value $R_Q$ of the column circuit may be greater than the composite resistance value $R_{SUB}$ of the sub-column circuit. The sub-column circuits 510 and 512 may be connected in series such that the composite resistance value of one column circuit 520 may be $2R_{SUB}$. Since the composite resistance value of one column circuit 520 is greater than the composite resistance value of one sub-column circuit 510, a smaller current may flow through $2R_{SUB}$ than when a voltage is applied to both ends of $R_{SUB}$. Since the small current flowing through the memory cell results in a small power consumption, the overall power efficiency may be increased.

Referring back to FIG. 5A, when the neural network operation is performed, a column circuit may be connected to one of the plurality of bit lines BL1', ..., and BLm' and may output one of the plurality of summation currents $I_1, \ldots,$ and $I_m$ to the bit line based on voltage applied to the plurality of word lines WL1, ..., and WLn. The column circuit may be connected to one of the plurality of source lines SL1', ..., and SLm', and a source voltage may be applied to the column circuit 520.

For example, when the neural network operation is performed, the column circuit 520 may be connected to one the bit line BL1' and may output the summation current $I_1$ based on the voltage corresponding to the activation applied to the plurality of word lines WL1, ..., and WLn and a weight value of "1" or "0" stored in each memory cell.

A high voltage may be applied to the first source line SL' of the column circuit 520, and a low voltage may be applied to the first bit line BL1' of the column circuit 520 such that memory cells included in the column circuit 520 may output a current.

A difference between a source voltage applied to the source line and voltage applied to the bit line may be smaller than the magnitude of voltage for changing the resistance value of the variable resistance element. The neural network apparatus 500 of one or more embodiments may perform a memory operation (for example, a reading or writing operation) described above with reference to FIGS. 4B and 4C in addition to the neural network operation. When a difference between voltages applied to the source line SL' and the bit line BL' of the column circuit 560 during the neural network operation is so large (or larger than a threshold), the weight value stored in each memory cell may be changed while the neural network operation is performed. Thus, the difference between the voltages applied to the source line SL1' and the bit line BL' of the column circuit 520 during the neural network operation may be smaller than a difference between voltages applied to the source line SL1' and the bit line BL' of the column circuit 520 while the memory operation is performed. As a non-limiting example, the voltage applied to the first source line SL' may be 1.2V, and the voltage applied to the bit line BL1' may be 1V. However, this is just an example, and voltage values applied to the source line or the bit line are not limited to the above-described values.

The neural network apparatus 500 may further include other components than the components shown in FIG. 5A. For example, the neural network apparatus 500 may further include one or more control circuits for controlling the voltage or current applied to the source line, the bit line, and the word line. Applying voltage using the neural network apparatus 500 may mean that voltage is applied using a control circuit.

Figure 6:
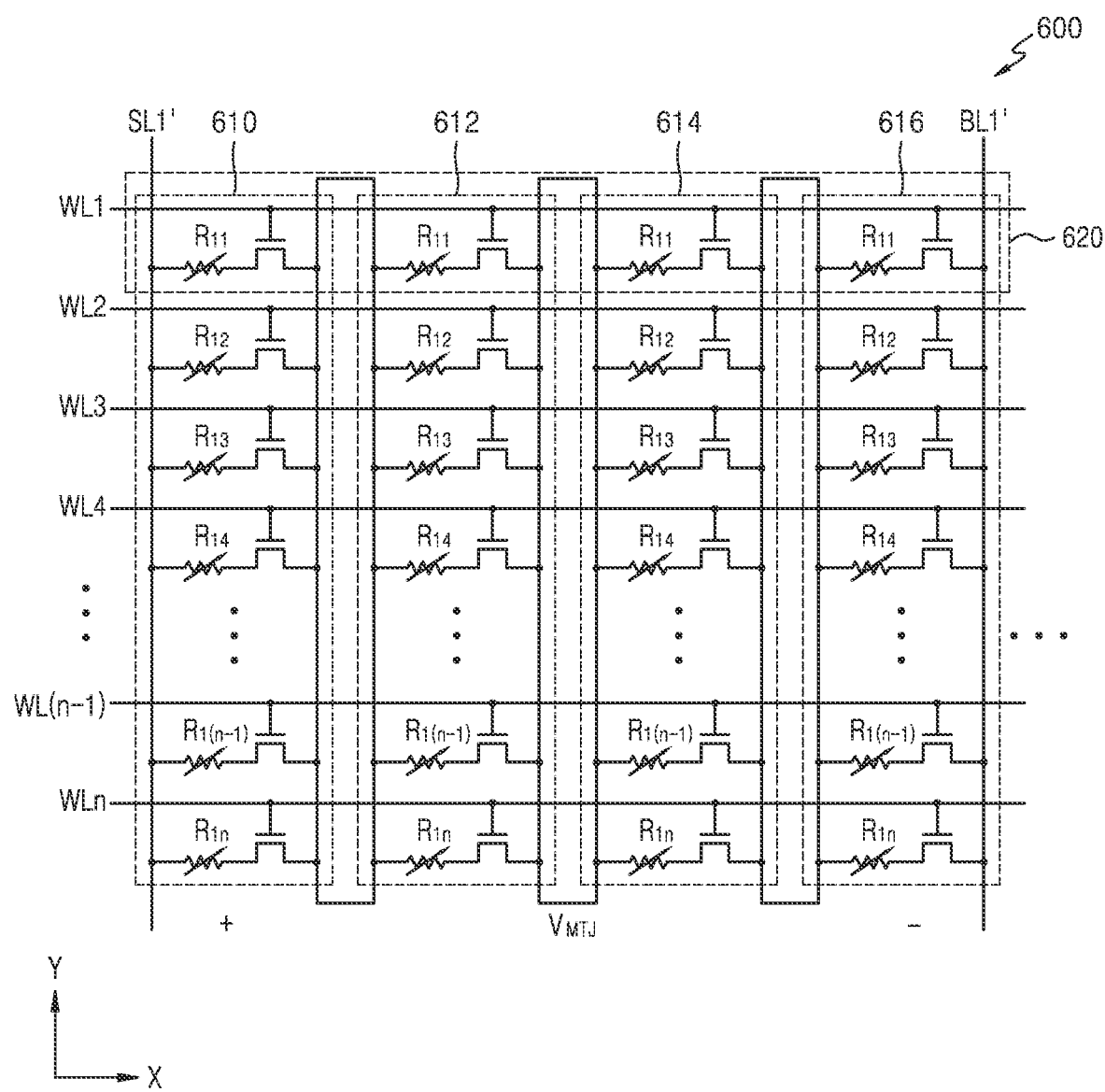
FIG. 6 illustrates a circuit diagram of a neural network apparatus according to one or more embodiments.

FIG. 6 illustrates a circuit diagram of a neural network apparatus according to one or more embodiments.

Referring to FIG. 6, a first sub-column circuit 610, a second sub-column circuit 612, a third sub-column circuit 614, and a fourth sub-column circuit 616 may be connected in series to constitute one column circuit. In FIG. 5A, two sub-column circuits (see 510 and 512 of FIG. 5A) are connected to constitute one column circuit. However, in the neural network apparatus 600, four sub-column circuits 610, 612, 614, and 616 may be connected in series to constitute one column circuit.

The summation resistance value of the one column circuit of FIG. 6 may be calculated by equation 3 below, for example.

$$R_{EQ} = 4R_{SUB} = \frac{1}{\frac{1}{R_{11}} + \frac{1}{R_{12}} + \ldots + \frac{1}{R_{1n}}} \times 4 = \frac{1}{\frac{1}{4 \times R_{11}} + \frac{1}{4 \times R_{12}} + \ldots + \frac{1}{4 \times R_{1n}}} \quad \text{Equation 3}$$

Referring to FIG. 3, a column circuit configured by connecting four sub-column circuits 610, 612, 614, and 616 in series may exhibit the same effect as increasing the resistance value of each unit memory device by four times. That is, the sub-column circuits 610, 612, 614, and 616 may be connected in series such that the same effect as connecting the variable resistance elements M having resistance values increasing by four times in parallel may be exhibited.

In this way, in a neural network apparatus of one or more embodiments, the number of sub-column circuits connected in series to constitute one column circuit is not limited to two sub-column circuits (as shown in FIG. 5A) and four sub-column circuits (as shown in FIG. 6). Column circuits included in one neural network apparatus may have the same structures or different structures. In order to design the low-power neural network apparatus 600, an appropriate number of sub-column circuits may be connected to each other to constitute one column circuit.

Variable resistance elements included in memory cells 620 that share one word line in a column circuit may have the same resistance values. For example, a variable resistance element $R_{11}$ of each of memory cells 620 that share the first word line WL1 may be set to $R_P$ or $R_{AP}$ that is the same resistance value. When the neural network operation is performed, voltage corresponding to "1" may be applied to the first word line WL1 such that the variable resistance element $R_{11}$ may be turned on, and a certain voltage may be applied to the source line SL1' of the column circuit and the bit line BL' of the column circuit, respectively. Thus, the same voltage may be applied to each variable resistance element $R_{11}$, and the same current may flow through each variable resistance element $R_{11}$ such that the memory cells 620 that share the first word line WL1 may function as one variable resistance element of $4R_{11}$.

Figure 7A:
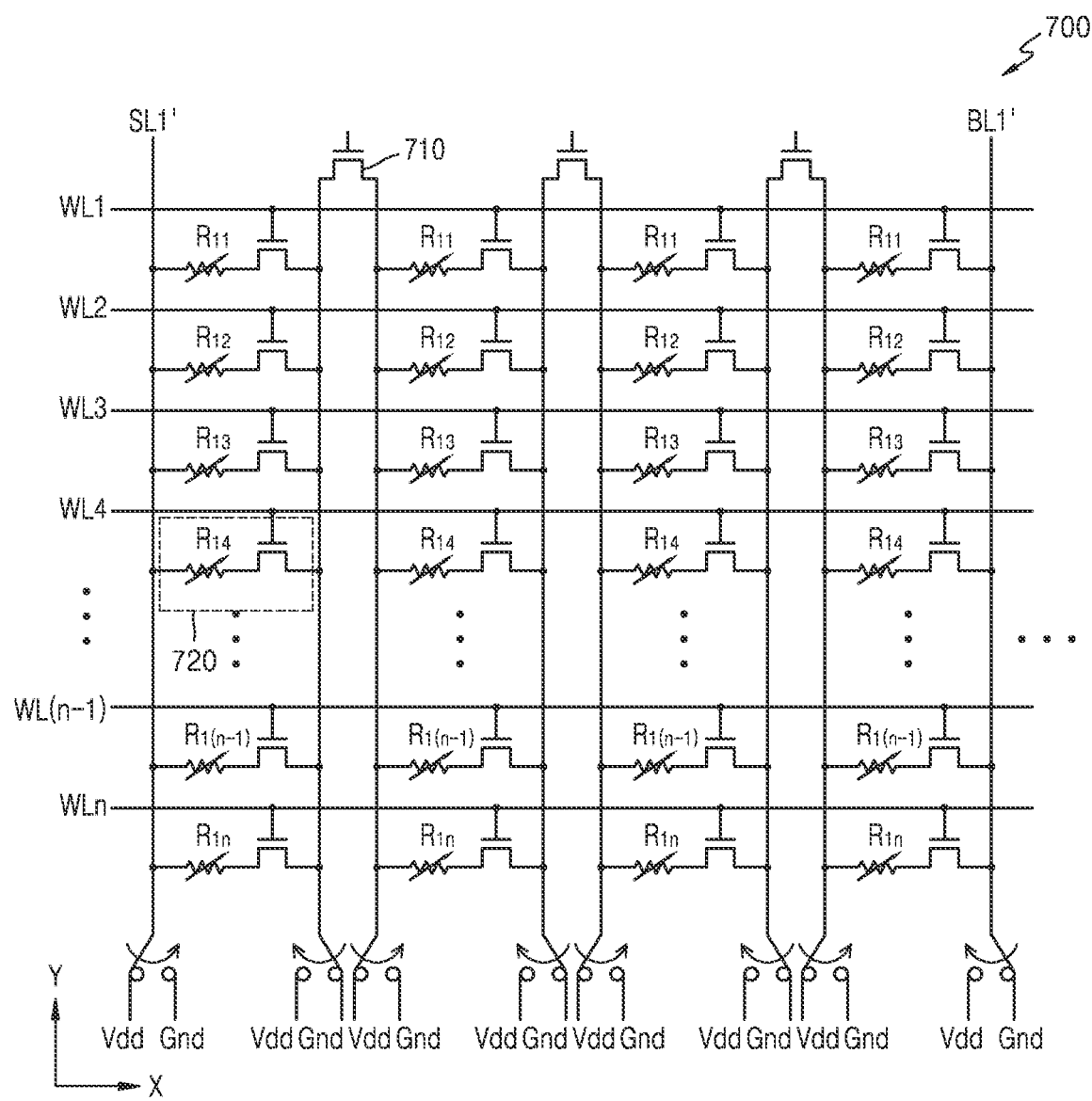
FIG. 7A illustrates a neural network apparatus and a process of performing a reading or writing operation by using the neural network apparatus according to one or more embodiments.

FIG. 7A illustrates a neural network apparatus and a process of performing a reading or writing operation by using the neural network apparatus according to one or more embodiments.

Referring to FIG. 7A, the neural network apparatus 700 may further include a transistor 710 that connect adjacent sub-column circuits from among two or more sub-column circuits. The transistor 710 may control whether the adjacent sub-column circuits are connected to each other. For example, the transistor 710 may connect the adjacent sub-column circuits to each other when the neural network apparatus 700 performs a neural network operation. When performing the neural network operation, the neural network apparatus 700 may connect the sub-column circuits to constitute one column circuit and to output a summation current.

When the transistor 710 performs a reading or writing operation on a plurality of memory cells by using the neural network apparatus 700, the transistor 710 may block connection of the adjacent sub-column circuits. Connection of the adjacent sub-column circuits may be blocked by the transistor 710 such that the neural network apparatus 700 may independently access each memory cell. The neural network apparatus 700 may perform a memory operation such as reading or writing in addition to the neural network operation. In order for each memory cell to perform a memory operation, the neural network apparatus 700 may access each memory cell independently. The neural network apparatus 700 may further include a transistor 710 for connecting the sub-column circuits to each other, thereby blocking serial connection between the sub-column circuits.

For example, when data "0" is written to the memory cell 720 indicated by a dotted line, the neural network apparatus 700 may apply voltage for turning off the additional transistor 710, apply voltage for turning on the transistor of the memory cell 720 to a fourth word line WL4, apply a voltage Vdd to the first source line (see SL1 of FIG. 4A) and apply a ground voltage to the first bit line (see BL1 of FIG. 4A). A method of writing data to the memory cell has been described above in FIGS. 4B and 4C and applied to an embodiment of FIG. 7A, and thus, a further detailed description thereof will be omitted.

Also, blocking a connection between adjacent sub-column circuits using an additional transistor to access a certain sub-column circuit has been described with reference to FIG. 7A. However, a method of accessing the certain sub-column circuit is not limited thereto. Hereinafter, a process of performing a reading or writing operation by using a neural network apparatus 701 will be described with reference to FIG. 7B.

Figure 7B:
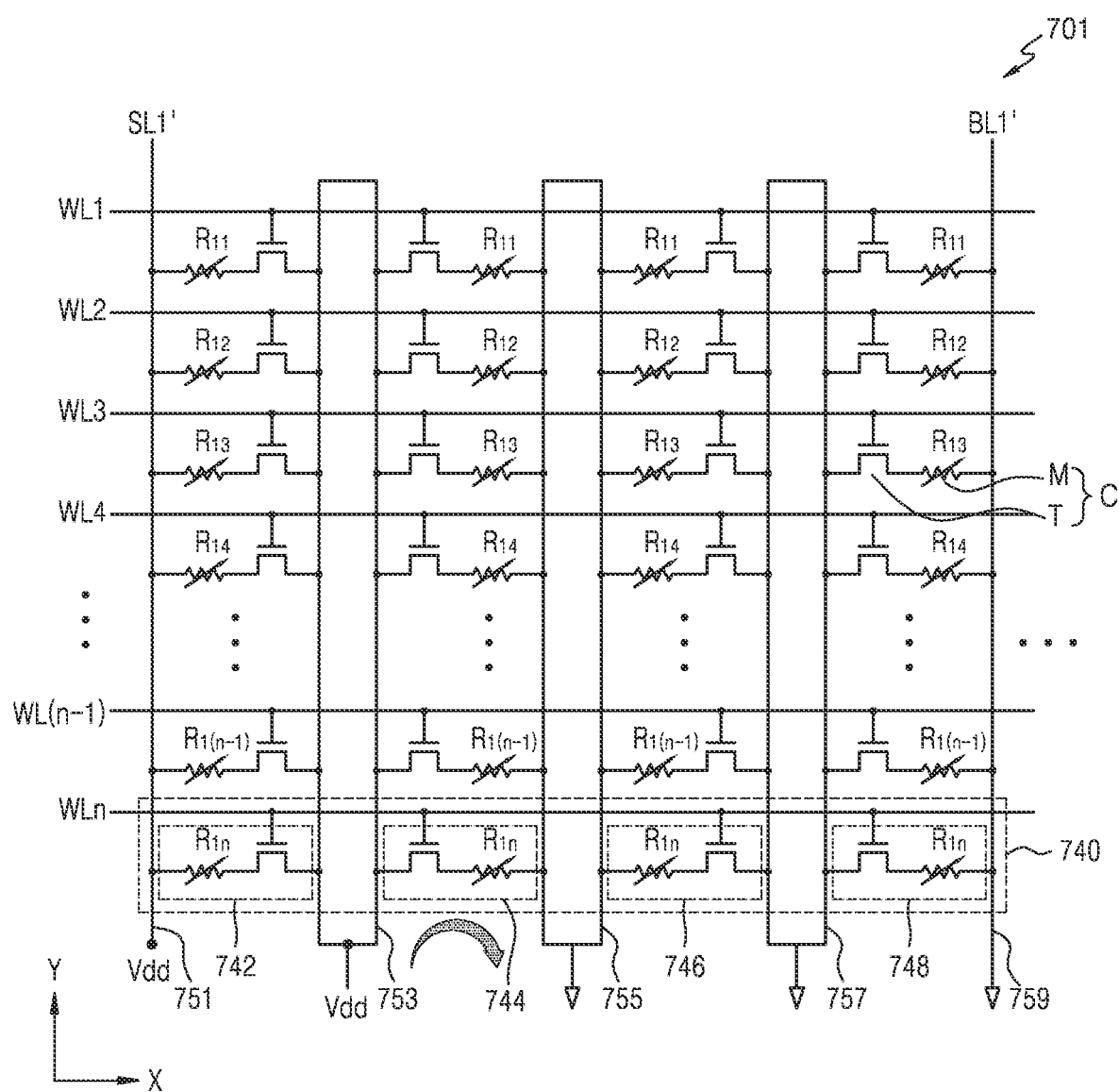
FIG. 7B illustrates a neural network apparatus and a process of performing a reading or writing operation by using the neural network apparatus according to one or more embodiments.

FIG. 7B illustrates a neural network apparatus and a process of performing a reading or writing operation by using the neural network apparatus according to one or more embodiments.

Referring to FIG. 7B, memory cells C included in each of sub-column circuits that are adjacent to one another in the second direction (x-direction) from among two or more sub-column circuits, may have a symmetric arrangement structure. In detail, the arrangement order of the variable resistance element M and the transistor T of the memory cells C of a first sub-column circuit may be symmetrical to the arrangement order of the variable resistance element M and the transistor T of memory cells C of a second sub-column circuit that is adjacent to the first sub-column circuit in the second direction, where the arrangement orders may be symmetric about a line in the first direction between the sub-column circuits.

The neural network apparatus 701 may apply different voltages to both ends of one memory cell 744, among the memory cells 740 that share one word line (memory cells 742, 744, 746, and 748), in one column circuit and may apply the same voltage to both ends of the other memory cells 742, 746, and 748 in the other column circuits, thereby performing a writing operation on the one memory cell 744.

When a difference in voltages applied to both ends of the memory cell C is equal to or greater than a certain threshold value, a resistance value of a variable resistance element M may be changed, and when there is no difference in voltages applied to both ends of the memory cell C, the resistance value of the variable resistance element M may be maintained. For example, when data corresponding to "1" is written to the second memory cell 744, the neural network apparatus 701 may apply voltage Vdd to one end 753 of the second memory cell 744 and may apply voltage Gnd to the other end 755 of the second memory cell 744. When Vdd is applied to one end 753 of the first memory cell 742, the neural network apparatus 701 may apply Vdd to the other end 751 of the first memory cell 742 such that the value of the variable resistance element $R_{1n}$ included in the first memory cell 742 may be maintained. When Gnd has been applied to one end 755 of the third memory cell 746, the neural network apparatus 701 may apply Gnd to the other end 757 of the third memory cell 746 such that the resistance value of the variable resistance element $R_{1n}$ included in the third memory cell 746 may be maintained. When Gnd has been applied to one end 757 of the fourth memory cell 748, the neural network apparatus 701 may apply Gnd to the other end 759 of the fourth memory cell 748 such that the value of the variable resistance element $R_{1n}$ included in the fourth memory cell 748 may be maintained.

When performing the neural network operation, the neural network apparatus 701 may apply voltage only to the first source line SL1' and the first bit line BL1' of the column circuit. The neural network apparatus 701 may configure lines or nodes 753, 755, and 757, that connect the remaining sub-column circuits in series, to be floated without applying voltage thereto. Thus, unlike the case where a memory operation is performed, one column circuit may perform a neural network operation.

Figure 8:
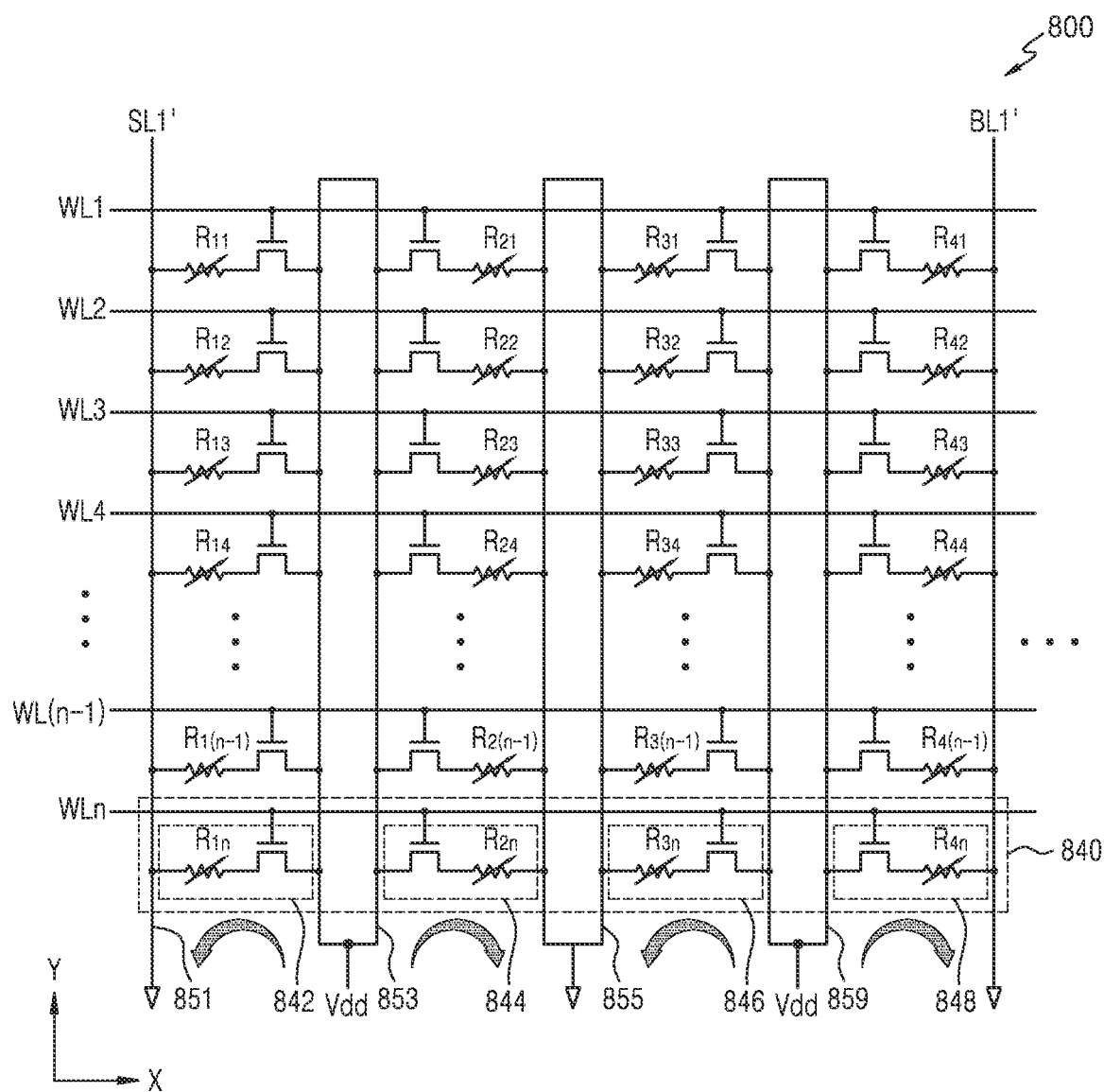
FIG. 8 illustrates a circuit diagram of a neural network apparatus in which a data value for a neural network operation is stored in some of a plurality of memory cells, according to one or more embodiments.

FIG. 8 illustrates a circuit diagram of a neural network apparatus in which a data value for a neural network operation is stored in some of a plurality of memory cells, according to one or more embodiments.

Referring to FIG. 8, variable resistance elements included in memory cells that share one word line during the neural network operation may have the same resistance value, as described with reference to FIG. 6. Also, when the neural network operation is not performed, each memory cell may perform a memory operation independently to have different resistance values. Thus, in the neural network apparatus 800, a weight value for the neural network operation may be stored only in one memory cell among the memory cells that share the one word line, and the remaining memory cells may be freely utilized in the memory operation, and when the neural network operation is performed, the weight value may be spread to the remaining memory cells.

When the neural network apparatus 800 preforms a reading or writing operation on a plurality of memory cells C, one of memory cells 840 for sharing one word line WLn in one column circuit may store a weight value for the neural network operation. The remaining memory cells from among the memory cells 840 that share the one word line WLn may perform a reading or writing operation independently. For example, a second memory cell 844 may store a weight value for the neural network operation even while the neural network apparatus 800 does not perform the neural network operation. The remaining memory cells 842, 846, and 848 may be independently read or written objects regardless of the weight value for the neural network operation. Thus, when not performing the neural network operation, the neural network apparatus 800 may utilize the remaining memory cells 842, 846, and 848 as general memory.

When the neural network apparatus 800 performs the neural network operation, the neural network apparatus 800 may spread the weight value stored in one memory cell to the remaining memory cells. Thus, the variable resistance elements included in the memory cells 840 that share one word line in the column circuit may have the same resistance value. For example, "1" may be stored as a weight value in the second memory cell 844. When the neural network apparatus 800 performs the neural network operation, the neural network apparatus 800 may spread "1" stored in the second memory cell 844 to the remaining memory cells 842, 846, and 848. "1" may be spread to the remaining memory cells 842, 846, and 848 such that the variable resistance elements included in the memory cells 840 that share an n-th word line WLn may have the same resistance value.

In order to spread the weight value of one memory cell 844 to the remaining memory cells 842, 846, and 848, the neural network apparatus 800 may apply different voltages to both ends of each memory cell. For example, when "1" is stored in the second memory cell 844, the neural network apparatus 800 may apply voltage Vdd to one end 853 of the second memory cell 844 and voltage Gnd to the other end 855 of the second memory cell 844. Thus, "1" may be stored in the second memory cell 844 as it is. Since Vdd is applied to one end 853 of the first memory cell 842, voltage Gnd that is different from Vdd may be applied to the other end 853 of the first memory cell 842. Thus, even when data of "1" and "0" is stored in the first memory cell 842, current may flow in the direction of an arrow such that data "1" may be stored in the first memory cell 842. The weight value stored in the second memory cell 844 may be stored in the third memory cell 846 and the fourth memory cell 848 in the same manner.

When performing the reading and writing operations, the neural network apparatus 800 may store a weight value by utilizing one memory cell among memory cells sharing one word line, and when performing the neural network operation, the neural network apparatus 800 may make a data value stored in memory cells sharing one word line be the same. Thus, even when the neural network apparatus 800 does not perform the neural network operation, memory cells may be efficiently utilized as a general memory resource.

Figure 9:
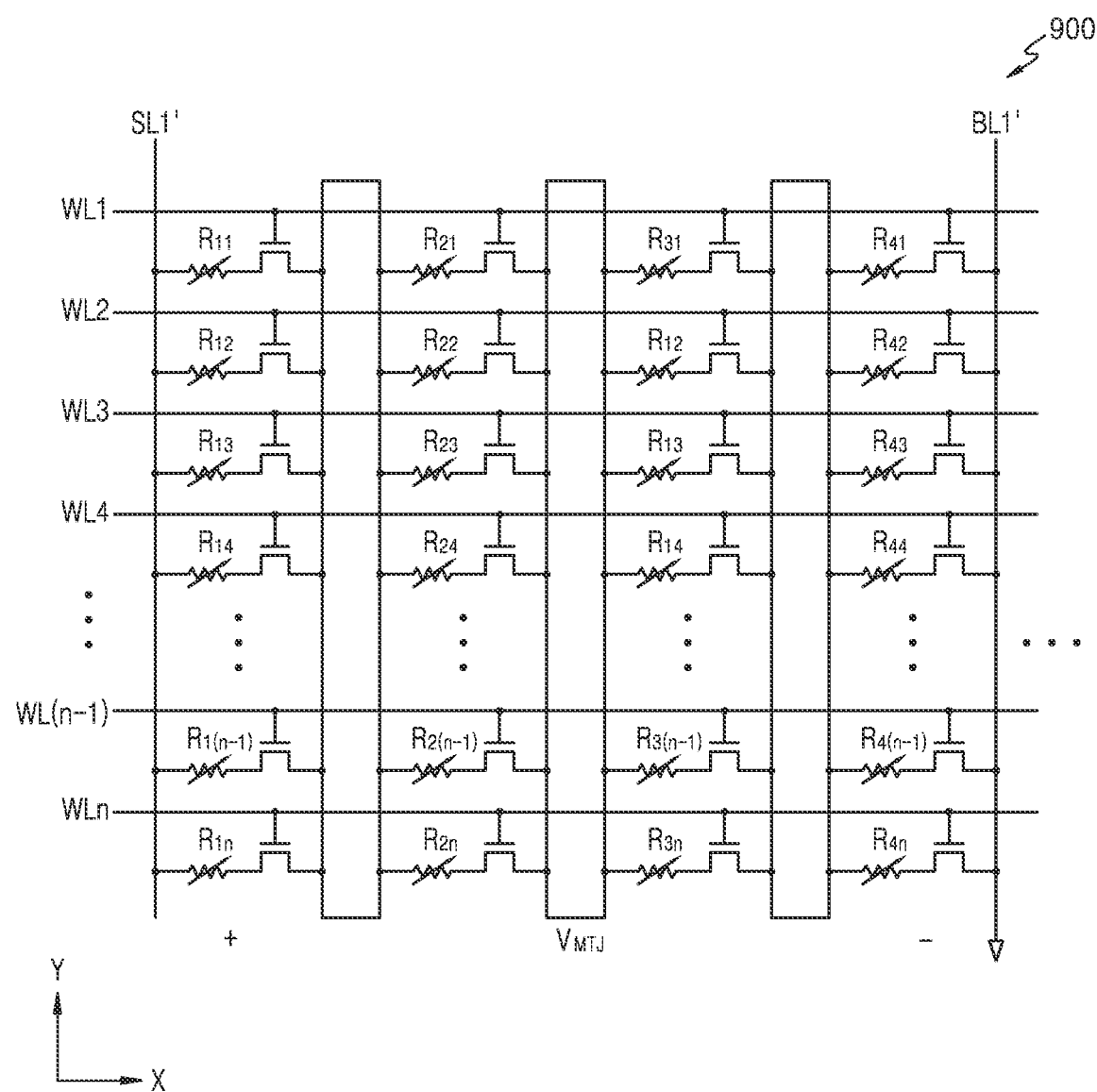
FIG. 9 illustrates a circuit diagram of a neural network apparatus according to one or more embodiments.

FIG. 9 illustrates a circuit diagram of a neural network apparatus according to one or more embodiments.

Referring to FIG. 9, unlike the neural network apparatus 600 of FIG. 6 in which variable resistance elements included in memory cells sharing one word line during the neural network operation have the same resistance value, variable resistance elements during the neural network operation of the neural network apparatus 900 may have independent resistance values.

In detail, variable resistance elements included in memory cells sharing one word line in a column circuit may have independent resistance values. As the variable resistance elements have independent resistance values, sub-column circuits that constitute one column circuit may store additional weight values. The neural network apparatus 900 may apply voltage to both ends SL1' and BL1' of the column circuit in which sub-column circuits for storing additional weight values are connected in series, thereby outputting a summation current to four different column circuits. Thus, the neural network apparatus 900 may implement partial summation.

Figure 10:
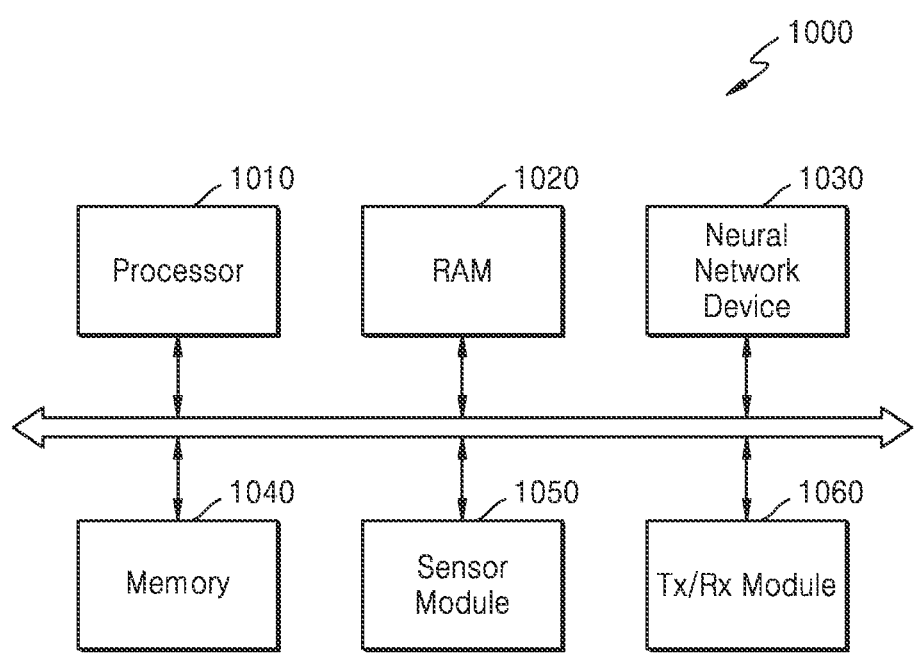
FIG. 10 illustrates an electronic system according to one or more embodiments.

FIG. 10 illustrates an electronic system according to one or more embodiments.

Referring to FIG. 10, an electronic system 1000 may analyze input data in real time based on a neural network to extract valid information and may determine situations based on extracted information or control configurations of an electronic device on which the electronic system 1000 is to be mounted. For example, the electronic system 1000 may be, or may be applied to, a robot device such as a drone, an advanced drivers assistance system (ADAS), a smart TV, a smart phone, a medical device, a mobile device, an image display device, a measurement device, and/or an IoT device, and may be mounted on at least one from among various types of electronic devices.

The electronic system 1000 may include a processor 1010 (e.g., one or more processors), RAM 1020, a neural network apparatus 1030, memory 1040 (e.g., one or more memories), a sensor module 1050 (e.g., one or more sensors), and a communication module 1060. The electronic system 1000 may further include an input/output module, a security module, a power control device, and the like. Some of hardware configurations of the electronic system 1000 may be mounted on at least one semiconductor chip.

The processor 1010 may control the overall operation of the electronic system 1000. The processor 1010 may include one processor core Singe core or a plurality of processor cores Multi-core. The processor 1010 may process or execute programs and/or data stored in the memory 1040. In some embodiments, the processor 1010 may execute programs stored in the memory 1040, thereby controlling the function of the neural network apparatus 1030. The processor 1010 may be implemented with a CPU, a GPU, and AP, or the like.

The RAM 1020 may temporarily store programs, data, or instructions. For example, the programs and/or data stored in the memory 1040 may be temporarily stored in the RAM 1020 according to a control or booting code of the processor 1010. The RAM 1020 may be implemented with memory such as dynamic RAM (DRAM) or static RAM (SRAM).

The neural network apparatus 1030 may perform an operation based on the received input data and may generate an information signal based on the result of performing. The neural network may include CNN, RNN, FNN, Deep belief networks, restricted Boltzman machines. However, embodiments are not limited thereto. The neural network apparatus 1030 may be a neural network dedicated hardware accelerator itself or a device including the same. The neural network apparatus 1030 may perform a reading or writing operation in addition to the operation of the neural network. In a non-limiting example, the neural network apparatus 1030 may be, or may include, any of the neural network apparatuses described above with reference to FIGS. 1-9

The information signal may include one of various types of recognition signals such as a voice recognition signal, an object recognition signal, an image recognition signal, a biometric information recognition signal. For example, the neural network apparatus 1030 may receive frame data included in a video stream as input data and may generate a recognition signal of an object included in an image indicated by the frame data from the frame data. However, embodiments are not limited thereto, and the neural network apparatus 1030 may receive various types of input data and generate a recognition signal according to the input data.

The memory 1040 that is a storage place for storing data may store an operating system (OS), various programs, and various data. In an embodiment, the memory 1040 may store intermediate results generated during the operation of the neural network apparatus 1030.

The memory 1040 may be DRAM. However, embodiments are not limited thereto. The memory 1040 may include at least one of volatile memory or non-volatile memory. The non-volatile memory may include ROM, PROM, EPROM, EEPROM, flash memory, PRAM, MRAM, RRAM, and FRAM. The volatile memory may include DRAM, SRAM, SDRAM, PRAM, MRAM, RRAM, and FeRAM. In an embodiment, the memory 1040 may include at least one of HDD, SSD, CF, SD, Micro-SD, Mini-SD, xD, and Memory stick.

The sensor module 1050 may collect information around an electronic device on which the electronic system 1000 is mounted. The sensor module 1050 may sense or receive a signal (for example, an image signal, a voice signal, a magnetic signal, a biometric signal, a touch signal, or the like) form the outside of the electronic device and may convert the sensed or received signal into data. To this end, the sensor module 1050 may include at least one of various types of sensing devices, such as a microphone, an image capturing device, an image sensor, a light detection and ranging (LIDAR) sensor, an ultrasonic sensor, an infrared sensor, a bio sensor, and a touch sensor.

The sensor module 1050 may provide the converted data as input data to the neural network apparatus 1030. For example, the sensor module 1050 may include an image sensor, may photograph an external environment of the electronic device to generate a video stream, may provide a continuous data frame of the video stream as input data to the neural network apparatus 1030 in order. However, embodiments are not limited thereto, and the sensor module 1050 may provide various types of data to the neural network apparatus 1030.

The communication module 1060 may include various wired or wireless interfaces that may communicate with an external device. For example, the communication module 1060 may include local area network (LAN), a wireless local area network (WLAN) such as wireless fidelity (Wi-fi), a wireless personal area network (WPAN) such as Bluetooth, wireless universal serial bus (USB), Zigbee, near field communication (NFC), radio-frequency identification (RFID), power line communication (PLC), or a communication interface that may be connected to a mobile cellular network, such as 3rd generation (3G), 4th Generation (4G), or long term evolution (LTE).

The analog crossbar arrays, row lines, column lines, memory cells, ADCs, memory cell arrays, column circuits, neural network apparatuses, sub-column circuits, transistors, electronic systems, processors, RAMs, memories, sensor modules, communication modules, word lines, bit lines, source lines, analog crossbar array 30, row lines 310, column lines 320, memory cells 330, ADC 40, memory cell array 400, memory cell 410, column circuit 420, neural network apparatus 500, sub-column circuit 510, sub-column circuit 512, column circuit 520, neural network apparatus 600, sub-column circuit 610, sub-column circuit 612, sub-column circuit 614, sub-column circuit 616, memory cells 620, neural network apparatus 700, transistor 710, neural network apparatus 701, memory cells 740, memory cell 742, memory cell 746, memory cell 748, neural network apparatus 800, memory cells 840, memory cell 842, memory cell 846, memory cell 848, neural network apparatus 900, electronic system 1000, processor 1010, RAM 1020, neural network apparatus 1030, memory 1040, sensor module 1050, communication module 1060, and other apparatuses, devices, units, modules, and components described herein with respect to FIGS. 1-10 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result.

In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A neural network apparatus comprising:
a plurality of memory cells each comprising a variable resistance element and a first transistor;
a plurality of bit lines extending in a first direction; and
a plurality of word lines extending in a second direction, crossing the bit lines and respectively connected to the first transistor of the plurality of memory cells;
a plurality of sub-column circuits each comprising memory cells of the memory cells connected in parallel along the first direction; and
a column circuit comprising two or more of the sub-column circuits connected in series along the second direction between first transistors of one of the sub-column circuits and variable resistance elements of another one of the sub-column circuits,
wherein, when a neural network operation is performed, the column circuit outputs a summation current to a bit line connected to the column circuit based on voltage applied to memory cells of a plurality of the sub-column circuits through the plurality of word lines.

2. The apparatus of claim 1, wherein a composite resistance value of the column circuit is greater than a composite resistance value of the sub-column circuit.

3. The apparatus of claim 1, wherein variable resistance elements included in memory cells that share one word line in the column circuit have a same resistance value.

4. The apparatus of claim 1, further comprising:
a second transistor configured to connect adjacent sub-column circuits from among the two or more sub-column circuits to each other,
wherein the second transistor is configured to:
connect the adjacent sub-column circuits to each other when the neural network operation is performed, and
block connection of the adjacent sub-column circuits when a reading or writing operation is performed on the plurality of memory cells.

5. The apparatus of claim 1, wherein the neural network apparatus is configured to perform a writing operation on one of memory cells sharing one word line in the column circuit by:
applying different voltages to both ends of the one memory cell; and
applying a same voltage to both ends of the remaining memory cells.

6. The apparatus of claim 1, wherein, when a reading or writing operation is performed on the plurality of memory cells, one of memory cells sharing one word line in the column circuit stores a weight value for the neural network operation, and remaining memory cells of the memory cells sharing the one word line perform a reading or writing operation.

7. The apparatus of claim 6, wherein, when the neural network operation is performed, the weight value stored in the one memory cell is spread to the remaining memory cells such that variable resistance elements included in the memory cells sharing one word line in the column circuit have a same resistance value.

8. The apparatus of claim 1, wherein memory cells included in each of sub-column circuits adjacent to each other in the second direction from among the two or more sub-column circuits have a symmetric arrangement structure.

9. The apparatus of claim 1, further comprising a source line configured to apply a source voltage to the column circuit, wherein a difference between the source voltage applied to the source line and a voltage applied to the bit line is less than a magnitude of a voltage that varies a resistance value of the variable resistance element.

10. The apparatus of claim 1, wherein the variable resistance element comprises a magnetic tunnel junction (MTJ) element.

11. The apparatus of claim 1, wherein the plurality of word lines extend side by side in the second direction.

12. A neural network apparatus comprising:
a plurality of word lines extending in a direction and connected to a column circuit; and
the column circuit, wherein
the column circuit comprises a bit line extending in another direction, and a plurality of sub-column circuits connected in series along the direction between first transistors of one of the sub-column circuits and variable resistance elements of another one of the sub-column circuits, each sub-column circuit comprising a plurality of magnetoresistive random-access memory (MRAM) cells connected in parallel along the other direction; and the column circuit is configured to output a summation current to the bit line based on voltage applied to MRAM cells of a plurality of the sub-column circuits through the plurality of word lines.

13. The apparatus of claim 12, wherein the column circuit comprises a transistor configured to connect adjacent sub-column circuits of the sub-column circuits in series along the direction, and to write data to an MRAM cell of the MRAM cells, a first voltage is applied to turn off the transistor, a second voltage is applied to one of the word lines connected to the MRAM cell to turn on a transistor of the MRAM cell, and a third voltage is applied to the bit line.

14. The apparatus of claim 12, wherein a first MRAM cell of the MRAM cells included in one of the sub-columns and a second MRAM cell of the MRAM cells included in another one of the sub-columns are connected in series by a shared end, and to write data to the first MRAM cell, a first voltage is applied to another end of the first MRAM cell, a second voltage is applied to the shared end, and the second voltage is applied to another end of the second MRAM cell.

15. The apparatus of claim 12, wherein a multiply-accumulate (MAC) result is generated based at least in part on the output summation current.

* * * * *